United States Patent [19]
Pezzani

[11] Patent Number: 5,838,110
[45] Date of Patent: Nov. 17, 1998

[54] APPARATUS AND METHOD FOR STARTING AND CONTROLLING A FLUORESCENT TUBE

[75] Inventor: Robert Pezzani, Vouvray, France

[73] Assignee: SGS-Thomson Microelectronics S.A., Saint Genis, France

[21] Appl. No.: 650,018

[22] Filed: May 17, 1996

[30] Foreign Application Priority Data

May 19, 1995 [FR] France .................................. 95 06265

[51] Int. Cl.⁶ .................................................. H05B 39/00
[52] U.S. Cl. ...................... 315/105; 315/101; 315/194; 315/DIG. 5; 257/121
[58] Field of Search ..................................... 315/101, 194, 315/105, 127, 289, 290, DIG. 5; 257/119, 120, 121

[56] References Cited

U.S. PATENT DOCUMENTS

| | | | |
|---|---|---|---|
| 3,422,309 | 1/1969 | Spira et al. | 315/194 |
| 4,503,359 | 3/1985 | Watanabe et al. | 315/105 |
| 4,673,844 | 6/1987 | Maytum et al. | 315/200 R |
| 5,023,521 | 6/1991 | Sridharan | 315/290 |
| 5,272,363 | 12/1993 | Pezzani | 257/173 |
| 5,365,086 | 11/1994 | Pezzani | 257/157 |
| 5,608,235 | 3/1997 | Pezzani | 257/119 |
| 5,608,237 | 3/1997 | Aizawa et al. | 257/132 |

FOREIGN PATENT DOCUMENTS

| | | |
|---|---|---|
| A-0 101 543 | 2/1984 | European Pat. Off. . |
| A-2 222 801 | 10/1974 | France . |
| A-2 541 843 | 10/1984 | France . |
| A-21 27 956 | 12/1972 | Germany . |

*Primary Examiner*—Robert J. Pascal
*Assistant Examiner*—Haissa Philogene
*Attorney, Agent, or Firm*—Wolf, Greenfield & Sacks, P.C.

[57] ABSTRACT

A starter unit for a fluorescent tube includes in parallel across two terminals, first and second main thyristors head-to-tail connected and a zener protection diode. The gate of the first thyristor is connected to one of the terminals through a resistor and to the other terminal through the series connection of an auxiliary thyristor with a zener diode (Z). The gate of the auxiliary thyristor is connected to a control terminal of the integrated circuit. The cathode of the auxiliary thyristor is connected with a supply terminal of the integrated circuit and to a storing capacitor. The gate of the second thyristor is connected to a control terminal of the integrated circuit.

35 Claims, 3 Drawing Sheets ively. The first terminal of filament r1 is connected to
APPARATUS AND METHOD FOR STARTING AND CONTROLLING A FLUORESCENT TUBE

BACKGROUND OF THE INVENTION

1. Field of the Invention

The present invention relates to a starter for a fluorescent tube and to a monolithic implementation thereof.

2. Discussion of the Related Art

FIG. 1 represents a conventional starter circuit for a fluorescent tube (for example a neon tube) with a solid-state switch. The fluorescent tube FT includes two electrodes separated by a gas in which fluorescence can occur. These two electrodes correspond to resistive filaments r1 and r2, respectan a.c. voltage source S (generally the mains) through an inductance L and a turn-on switch SW. The first terminal of filament r2 is connected to the second terminal of the source S. The second terminals, A1 and A2, of filaments r1 and r2 are connected to the a.c. inputs of a rectifying diode bridge DB. The d.c. terminals of the rectifying bridge DB are connected to a switch which, in the illustrated embodiment, is formed by a thyristor Th. The gate of thyristor Th is connected to the positive terminal of the bridge DB through a resistor R and to the negative terminal of the bridge DB through an integrated circuit IC.

As soon as the circuit is powered on, the thyristor Th is rendered conductive by a current flowing through resistor R. As a consequence, a current flows in filaments r1 and r2 and heats them. During a start phase, the thyristor Th is turned off during a half-period due to the integrated circuit IC which short-circuits the gate and cathode terminals of the thyristor Th. The inductance L tends to maintain the current which fed the fluorescent tube FT at the instant of the turn off. Therefore the voltage between terminals A1 and A2 increases rapidly and the fluorescent tube is triggered. Once triggering is obtained, thyristor Th remains off and the fluorescent tube triggers again by itself at each half-period.

Such a circuit has several drawbacks.

A first drawback is that the voltage drop in the solidstate switching circuit IC is high because it corresponds to two diode voltage drops plus the voltage drop across the thyristor in the conductive state.

A further drawback is that a specific supply source must be provided for supplying the control integrated circuit.

SUMMARY OF THE INVENTION

An object of the present invention is to provide a starter unit for a fluorescent tube that obviates the above drawbacks.

Another object of the present invention is to provide a unit which can be achieved in the form of a monolithic semiconductor component.

According to the invention, a starter unit for a fluorescent tube is associated with a load circuit including an A.C. supply source in series with a ballast inductance and a first and a second filament of the fluorescent tube. The unit is connected between the second terminals of the filaments and includes, across the second terminals, first and second main thyristors head-to-tail connected and a zener protection diode in series with a diode; and a control integrated circuit. The gate of the first thyristor is connected to one of the second terminals through a resistor and to the other of the second terminals through the series connection of an auxiliary thyristor with a zener diode. The gate of the auxiliary thyristor is connected to a control terminal of the integrated circuit and to the other of the second terminals through a resistor. The cathode of the auxiliary thyristor is connected with a supply terminal of the integrated circuit and to said one of the second terminals through a storing capacitor. The gate of the anode-gate main thyristor is connected to a control terminal of the integrated circuit.

According to an embodiment of the invention, in a semiconductor component implementing the above unit, the first thyristor and the auxiliary thyristor are vertical thyristors having their cathode gate regions formed by P-type wells disposed inside a lower doped P-type well; and the second thyristor is an anode gate vertical thyristor having its anode formed by a layer of the same type and same doping level as the gate wells of the first thyristor and of the auxiliary thyristor, said anode layer being surrounded by a guard ring having the same conductivity type as the anode with a lower doping level.

The foregoing and other objects, features, aspects and advantages of the invention will become apparent from the following detailed description of the present invention when taken in conjunction with the accompanying drawings.

DETAILED DESCRIPTION

Figure 1:
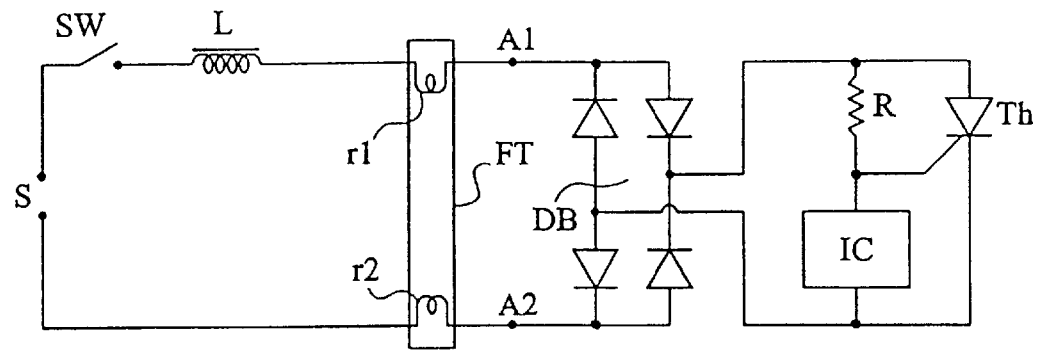
FIG. 1 represents a conventional starter circuit for a fluorescent tube.
Figure 2:
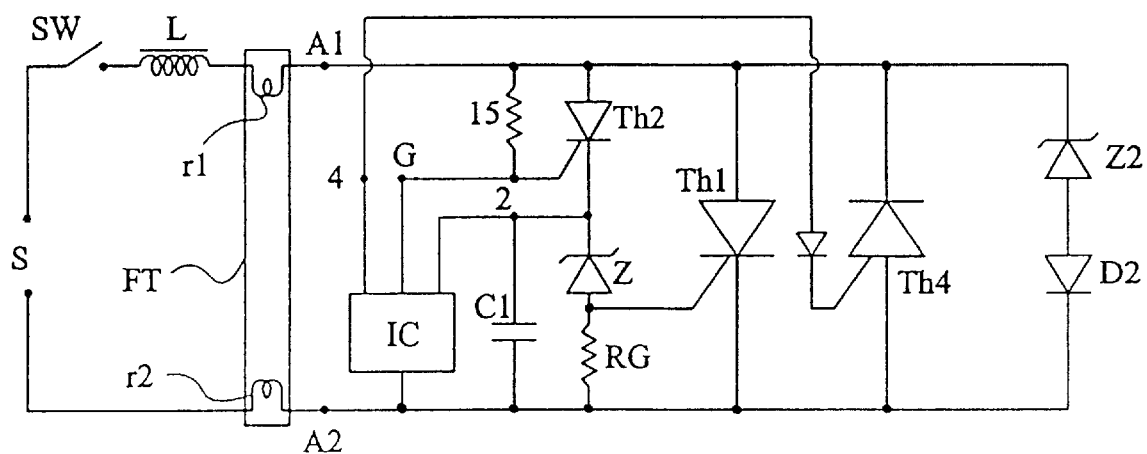
FIG. 2 represents a starter circuit for a fluorescent tube according to an embodiment of the invention.

FIG. 2 represents a circuit according to an embodiment of the invention. In FIG. 2, the second terminal A1 of the filament r1 is connected to the anode of a thyristor Th1 and to the cathode of a thyristor Th4. The second terminal A2 of the filament r2 is connected to the cathode of thyristor Th1 and to the anode of thyristor Th4. The gate of thyristor Th1 is connected to terminal A2 through a resistor RG and to terminal A1 through the series connection of a thyristor Th2 and a zener diode Z. The gate of thyristor Th2 is connected to its anode through a resistor 15 and corresponds to a terminal G of a control integrated circuit IC. The cathode of thyristor Th2 is connected to a terminal 2 which corresponds to a terminal of the integrated circuit IC and to a first terminal of a capacitor C1 which is connected between terminal 2 and terminal A2. The thyristor Th4 is controlled at its anode by a positive current. A terminal 4 of the integrated circuit IC controls the gate of thyristor Th4. FIG. 2 also represents a protection zener diode Z2 in series with a direct diode D2, coupled between the main terminals of the thyristors Th1 and Th4.

In a practical application in which the supply voltage S corresponds to the mains (220 V rms), the following parameters can be used:

avalanche voltage of the diode Z: 10 volts, resistor R1: 100 kΩ, avalanche voltage of diode Z2: from 900 to 1500 V, capacitance of capacitor C1: from 3 to 5 microfarads, thyristor Th2: sensitive thyristor controllable by a current lower than 1 mA and blockable by a negative gate voltage, thyristor Th1: power thyristor with a high hold current (IH1), for example 350 mA, thyristor Th4: anode gate thyristor having conventional characteristics.

The operation of the circuit of FIG. 2 may be better understood in relation to FIGS. 3A–3F, in which the time interval elapsed before time $t_{10}$ corresponds to the initial heating of the filaments, and the time interval following time $t_{10}$ corresponds to the starting of the fluorescent tube and to its subsequent operation.

Figure 3A:
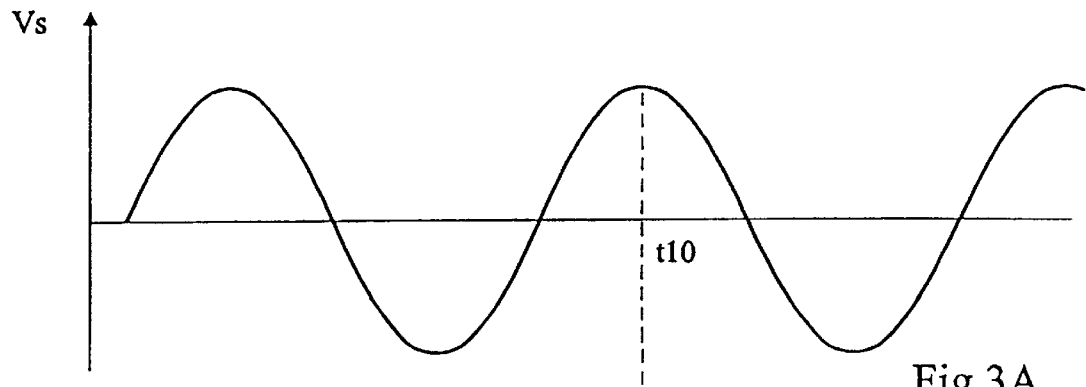
FIGS. 3A–3F are curves illustrating the voltage and current waveform at various points of the starter circuit of FIG. 2.
Figure 3B:
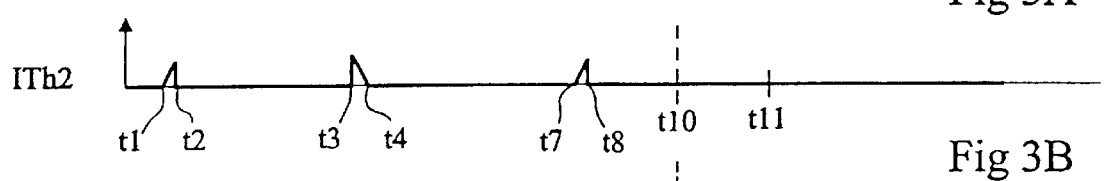
Figure 3C:
Figure 3D:
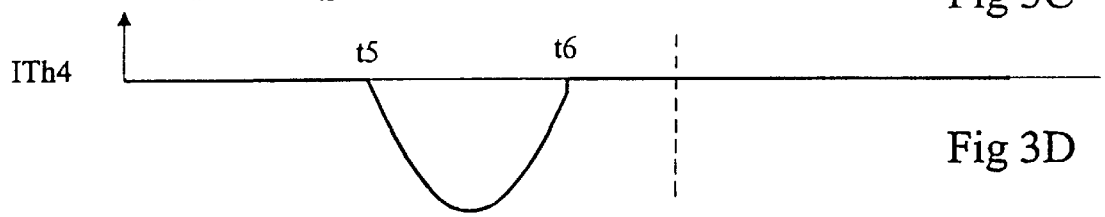
Figure 3E:
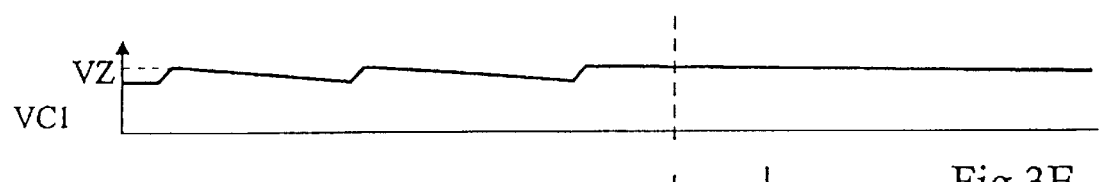
Figure 3F:
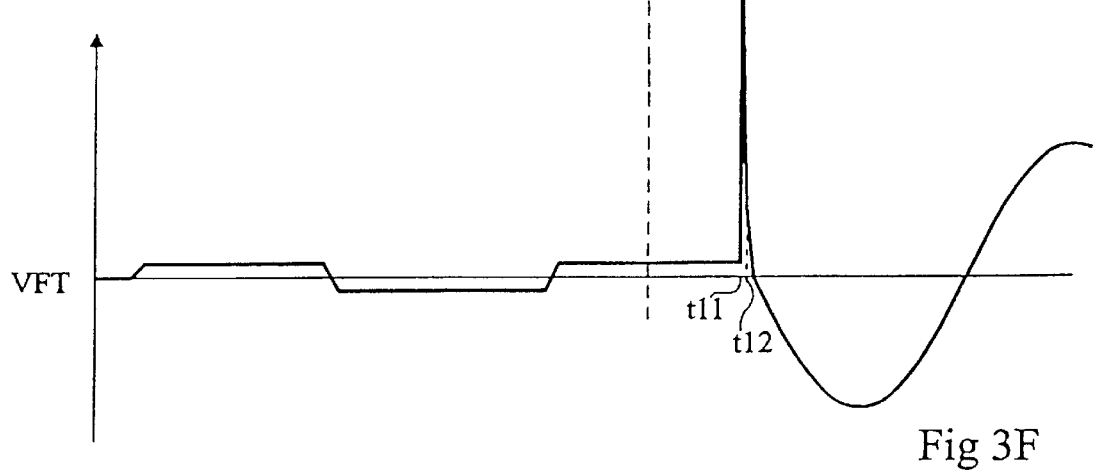

In the heating mode, an initial conduction of thyristor Th2 between times $t_1$ and $t_2$ is followed by conduction of thyristor Th1 at time $t_2$ when the voltage across the terminals of diode Z exceeds the avalanche voltage of diode Z. As represented by the curve VC1 of FIG. 3E, the capacitor C1 is charged during the period $t_1$–$t_2$. Then, during the conduction period of thyristor Th2, capacitor C1 very slightly discharges to supply the integrated circuit IC. During this period, voltage VFT across the fluorescent tube remains substantially constant, and corresponds to the voltage drop across thyristor Th1, as represented in FIG. 3F.

As indicated above, the thyristor Th1 may have a high hold current IH1. Thus, at time $t_3$ at which the supply voltage VS is not negligible, thyristor Th1 is blocked and thyristor Th2 becomes conductive again. Between time $t_3$ and time $t_4$, which corresponds to the end of a half-period, capacitor C1 is charged again. Thus, a very regular charge of the capacitor C1 is obtained, which is substantially balanced at the end and at the beginning of each half-period.

At time $t_5$, the integrated circuit IC controls thyristor Th4 to become conductive. As a result, thyristor Th4 becomes conductive (possibly with a slight delay as represented in curve Ith4 of FIG. 3D). This conduction is stopped at time $t_6$ when current is near 0, this thyristor having a low hold current IH4. It will be noted that the gate current, which is positive, is provided to the anode gate of thyristor Th4 by the integrated circuit from the capacitor C1 which has just been charged again.

Between times $t_7$ and $t_8$, the waveform is the same as between $t_1$ and $t_2$.

At time $t_{10}$ the filaments are sufficiently heated and it is desired to trigger the fluorescent tube. At time $t_{11}$, which is the time at which thyristor Th1 is turned off, the integrated circuit IC shorts terminals G and A2. Thyristor Th2 receives the reverse voltage of the capacitor C1 at its gate and is turned off. The ballast inductance L tends to maintain the current flowing therethrough. The voltage between terminals A1 and A2 rapidly increases up to the avalanche voltage of diode Z2 (see FIG. 3F). Thus, the fluorescent tube FT may be lighted and the voltage between its terminals is fixed by the current imposed by the inductance L. The inductance L acts as a current generator, and the voltage across the fluorescent tube FTdrops to approximately 100 volts. Such a voltage is insufficient to trigger again the lightening circuit which remains in a stand-by state. If the fluorescent tube is not triggered, diode Z2 acts as a protection component and, when the avalanche voltage of diode Z2 is reached, diode Z2 becomes conductive. Then the above-described phenomenon is repeated at each end of a positive half-period until the fluorescent tube triggers.

It may be noted that, to fabricate a semiconductor component implementing the functions achieved by the circuit of FIG. 2, thyristors Th1 and Th2 may be adapted to withstand a high forward voltage which is higher than the avalanche voltage of zener diode Z2 and that thyristors Th1 and Th2 may be adapted to withstand the reverse voltage of the mains. Similarly, thyristor Th4 must be adapted to withstand a voltage higher than the avalanche voltage of diode Z2 in the reverse mode and the mains voltage in the forward mode.

Figure 4A:
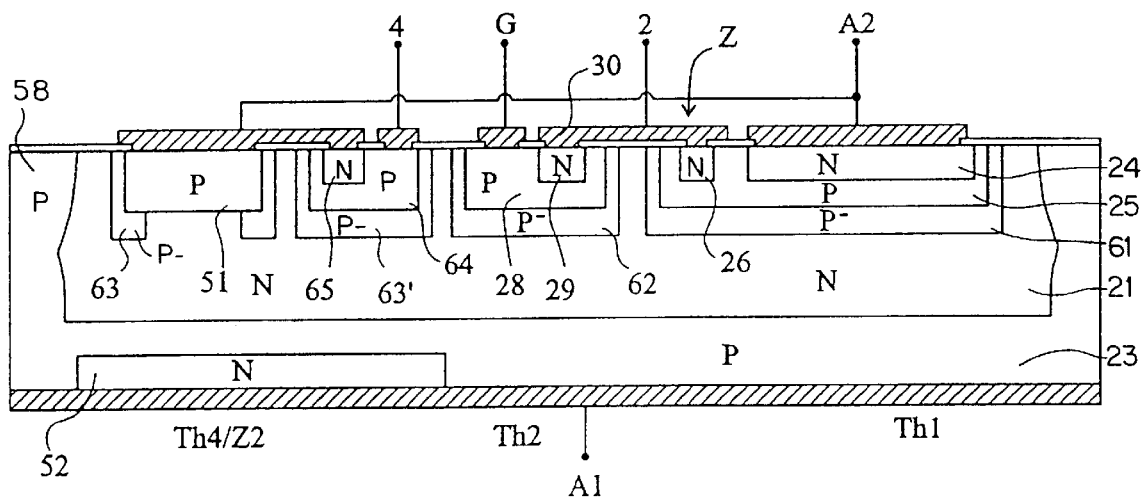
FIGS. 4A and 4B are a schematic cross-sectional view and a top view, respectively, of a monolithic semiconductor component for starting a fluorescent tube according to an embodiment of the invention.
Figure 4B:
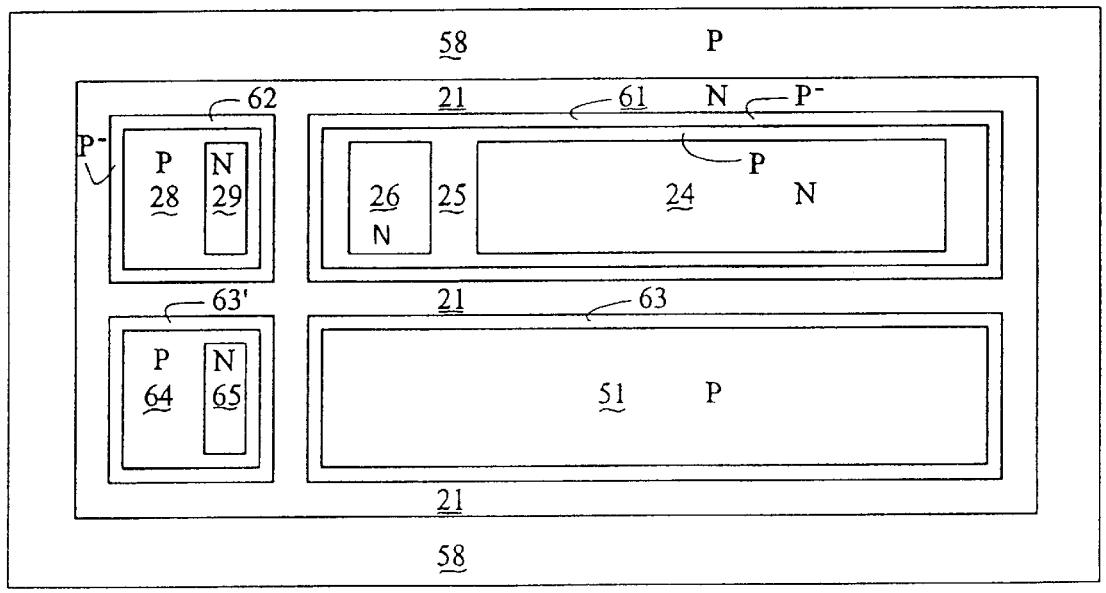

FIGS. 4A and 4B are a schematic cross-sectional view and top view of a circuit adapted to withstand such a high voltage. It will be noted that FIG. 4A, is very schematic, as usual in the field of representation of semiconductor components. Additionally, the top view of FIG. 4B does not strictly correspond to the cross-sectional view of FIG. 4A. Those skilled in the art will be able to adjust the surface and the disposition of the various layers and regions to optimize the characteristics of the component and more particularly the possible current flow and the zener voltage.

In the example shown in FIGS. 4A and 4B, the component is formed from an N-substrate. The bottom surface of the component includes a P-type layer 23 coated with a bottom surface metallization A which corresponds to the anode of thyristors Th1 and Th2. Thyristor Th1 is vertically disposed and includes from the upper surface a cathode layer 24 having emitter shorts, formed in a P-type well 25, in turn formed in substrate 21. In a portion of well 25 is formed an N-type region 26 which forms with well 25 a zener junction corresponding to diode Z. A second P-type well 28 including an N-type region 29 forms the vertical thyristor Th2. Thyristor Th2 includes regions 29, 28, 21 and 23. The cathode 29 of thyristor Th2 is connected through a metallization 30 to the cathode 26 of the zener diode Z.

Metallization 30 corresponds to the supply terminal 2 of FIG. 2. The well 28 is coated with a gate metallization G. Resistor RG is formed by the resistance of region 25 beneath the cathode layer 24.

A P-type well 51 is formed in the upper portion of the substrate. On the lower surface side, beneath well 51 and at least a portion of the gate region 28, is formed an N-type region 52. Regions 51, 21, 23 and 52 form the thyristor Th4. A metallization coating well 51 is connected to the metallization which covers region 24 and forms the main electrode A2.

Close to well 41 is formed a P region 64 connected with a gate metallization 4. An N-region 65 is formed in region 64 and is connected through a metallization to the anode 51 of thyristor Th4. When a voltage, positive with respect to terminal A2, is applied to gate 4, a current flows from region 64 toward region 65. If terminal A1 is then negative with respect to terminal A2, the thyristor Th4 is forward biased and will be triggered.

Of course, various modifications and improvements can be brought to this structure. For example, a P-well 58 has been shown around the structure.

Additionally, at least of the upper surface P-wells are formed in a P⁻ diffusion to improve the breakdown voltage of the various components. Thus, well 25 is disposed in a P⁻ well 61, well 28 in a P⁻ well 62, and region 64 in a P⁻ well 63'. The anode 51 of thyristor Th4 is surrounded by a P⁻ ring 63. The P⁻ ring is sufficiently low-doped with respect to layer 51 so that the junction between layer 51 and substrate 21 breaks over at a voltage that is lower than the junction between the various layers having the same doping level, 61, 62 and 63, and substrate 21. This junction between layer 51 and substrate 21 constitutes the zener diode Z2. The zener diode Z2 is adapted to draw the high energy stored in the inductance because the break over occurs in the bulk. The current flow capacity of diode Z2 can also be increased by increasing its surface. Hence, layer 51 forms the anode of thyristor Th1 and the anode of zener diode Z2 (its cathode being the substrate 21), the diode D2 being disposed between the P-layer 23 and the N-substrate 21.

The N-regions 24 and 52 which form the cathodes of thyristors Th1 and Th4 can have conventional emitter shorts. These shorts are more particularly used to adjust the hold current IH1 of thyristor Th1. The density of the shorting holes is smaller in thyristor Th4 to not excessively reduce its sensitivity.

FIG. 4B is a schematic top view of an embodiment of the component of FIG. 4A, without showing metallizations. Each layer of FIG. 4B is referenced in correspondence with FIG. 4A.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A starter unit for a fluorescent tube powered by an AC supply source in series with a ballast inductance, the fluorescent tube having a first control terminal and a second control terminal, the starter unit comprising:
   a first thyristor having an anode coupled to the first control terminal, a cathode coupled to the second control terminal, and a gate;
   a second thyristor having an anode coupled to the second control terminal, and a cathode coupled to the first terminal;
   a series connection of a diode and a first zener diode coupled between the first control terminal and the second control terminal;
   a first resistor coupled between the second control terminal and the gate of the first thyristor;
   a control integrated circuit for controlling an on state and off state of the first thyristor, the control integrated circuit having a first control terminal that is coupled to the gate of the first thyristor, a second control terminal, and a supply terminal;
   a series connection of an auxiliary thyristor and a second zener diode, coupled between the gate of the first thyristor and the anode of the first thyristor, the auxiliary thyristor having a gate that is coupled to the second control terminal of the integrated circuit and a cathode that is coupled to the supply terminal of the control integrated circuit.

2. The starter unit of claim 1, wherein:
   the first thyristor includes a vertical transistor having a cathode gate region formed by a first P-type well disposed within a second P-type well that is doped lower than the first P-type well;
   the auxiliary thyristor includes a vertical transistor having a cathode gate region formed by a third P-type well disposed within a fourth P-type well that is doped lower than the second P-type well;
   the second thyristor includes an anode gate vertical thyristor, the anode of which is formed by an anode layer of a substantially similar type and doping level as the second P-type well, the anode layer being surrounded by a guard ring having a same conductivity type as a conductivity type of the anode, the guard ring having a lower doping level than a doping level of the anode.

3. The starter unit of claim 1, wherein the control integrated circuit includes a third control terminal that is coupled to a gate of the second thyristor, to control the second thyristor.

4. The starter unit of claim 1, further comprising a capacitor having a first terminal coupled to the gate of the auxiliary thyristor and a second terminal coupled to the second control terminal.

5. The starter unit of claim 4, wherein the capacitor includes means for providing power to the control integrated circuit.

6. The starter unit of claim 1, wherein:
   the AC supply source has a positive phase and a negative phase;
   the first thyristor conducts current from the AC supply source through the fluorescent tube in a first direction during the positive phase; and
   the second thyristor conducts current from the AC supply source through the fluorescent tube in a second direction during the negative phase.

7. A method for controlling a flourescent tube that is powered by an alternating power source having a positive phase and a negative phase, comprising the steps of:
   (A) during a first portion of the positive phase, conducting current from the alternating power source through the fluorescent tube and sensing an amount of voltage provided by the alternating power source;
   (B) in response to step (A), conducting current from the alternating power source through the fluorescent tube in a first direction through a first unidirectional device during a second portion of the positive phase; and
   (C) during the negative phase, conducting current from the alternating power source through the fluorescent tube in a second direction through a second unidirectional device.

8. The method of claim 7, wherein:
   step (B) includes conducting current through the first unidirectional device only during the second portion of the positive phase.

9. The method of claim 7, wherein:
   step (B) includes conducting current through a first thyristor; and
   step (C) includes conducting current through a second thyristor.

10. A method for controlling a fluorescent tube that is powered by an alternating power source having a positive phase and a negative phase, comprising the steps of:
    (A) during a first portion of the positive phase, sensing an amount of voltage provided by the alternating power source and storing a charge from the alternating power supply during the first portion of the positive phase, to provide a stored charge;
    (B) in response to step (A), conducting current from the alternating power source through the fluorescent tube in a first direction through a first unidirectional device during a second portion of the positive phase; and
    (C) during the negative phase, conducting current from the alternating power source through the fluorescent tube in a second direction through a second unidirectional device.

11. The method of claim 10, wherein the steps of the method are controlled by an integrated circuit that is powered by the stored charge.

12. The method of claim 10, wherein the step of storing a charge includes activating a switch to provide current to a capacitor until a predetermined amount of charge is stored in the capacitor.

13. An apparatus for controlling a fluorescent tube that is powered by an alternating power source having a positive phase and a negative phase, comprising:

first means for sensing an amount of voltage provided by the alternating power source during a first portion of the positive phase;

second means, responsive to the first means, for conducting current from the alternating power source through the fluorescent tube in a first direction through a first unidirectional device during a second portion of the positive phase; and third means, distinct from the first means, for conducting current from the alternating power source through the fluorescent tube in a second direction through a second unidirectional device during the negative phase.

14. The apparatus of claim 13, wherein:

the second means includes means for conducting current through the first unidirectional device only during the second portion of the positive phase.

15. The apparatus of claim 13, wherein:

the second means includes a first thyristor; and the third means includes a second thyristor.

16. An apparatus for controlling a fluorescent tube that is powered by an alternating power source having a positive phase and a negative phase, comprising:

first means for sensing an amount of voltage provided by the alternating power source during a first portion of the positive phase, the first means including means for storing a charge from the alternating power supply, to provide a stored charge;

second means, responsive to the first means, for conducting current from the alternating power source through the fluorescent tube in a first direction through a first unidirectional device during a second portion of the positive phase; and third means, distinct from the first means, for conducting current from the alternating power source through the fluorescent tube in a second direction through a second unidirectional device during the negative phase.

17. The apparatus of claim 16, further comprising an integrated circuit that is powered by the stored charge, the integrated circuit providing control to the first and second means.

18. The apparatus of claim 16 wherein the means for storing includes:

a capacitor; and a switch means for providing current to the capacitor until a predetermined amount of charge is stored in the capacitor.

19. A circuit for controlling a fluorescent tube that is powered by an alternating power source having a positive phase and a negative phase, the fluorescent tube having a first filament with a first terminal and a second terminal and having a second filament with a first terminal and a second terminal, the circuit comprising:

a first switch having a first terminal coupled to the second terminal of the first filament, a second terminal coupled to the second terminal of the second filament, and a control terminal;

a second switch having a first terminal coupled to the second terminal of the second filament, a second terminal coupled to the second terminal of the first filament, and a control terminal; and a control circuit coupled to the control terminal of the first switch and to the control terminal of the second switch, the control circuit activating the first switch during the positive phase and activating the second switch during the negative phase, whereby during said activation current is conducted from the second terminal of the first filament to the second terminal of the second filament.

20. A circuit for controlling a fluorescent tube that is powered by an alternating power source having a positive phase and a negative phase, the fluorescent tube having a first filament terminal and a second filament terminal, the circuit comprising:

a first switch having a first terminal coupled to the first filament terminal, a second terminal coupled to the second filament terminal, and a control terminal;

a second switch having a first terminal coupled to the second filament terminal, a second terminal coupled to the first filament terminal, and a control terminal;

a control circuit coupled to the control terminal of the first switch and to the control terminal of the second switch, the control circuit activating the first switch during the positive phase and activating the second switch during the negative phase; and storage element, coupled to the control circuit, the storage element storing charge from the alternating power source and providing the charge to the control circuit to power the control circuit.

21. The circuit of claim 20, further comprising a third switch coupled between the first filament terminal and the storage element, the third switch having a control terminal coupled to the control circuit.

22. The circuit of claim 20, wherein:

the storage element includes a capacitor having a first terminal, and a second terminal coupled to the second filament terminal; and the third switch includes a thyristor having an anode coupled to the first filament terminal, a cathode coupled to the first terminal of the capacitor, and a gate terminal coupled to a control output terminal of the control circuit.

23. The circuit of claim 20, further comprising a voltage limiting device coupled between the storage element and the control terminal of the first switch, the voltage limiting device delaying activation of the first switch until the storage device is charged a predetermined amount.

24. The circuit of claim 23, wherein the voltage limiting device includes a zener diode having a cathode coupled to the storage device and an anode coupled to the control terminal of the first switch.

25. The circuit of claim 19, wherein:

the first switch includes a first thyristor having an anode coupled to the second terminal of the first filament, a cathode coupled to the second terminal of the second filament, and a gate coupled to the control circuit;

the second switch includes a second thyristor having an anode coupled to the second terminal of the second filament, a cathode coupled to the second terminal of the first filament, and a gate coupled to the control circuit.

26. A circuit for controlling a fluorescent tube that is powered by an alternating power source having a positive phase and a negative phase, the fluorescent tube having a first filament terminal and a second filament terminal, the circuit comprising:

a first switch having a first terminal coupled to the first filament terminal, a second terminal coupled to the second filament terminal, and a control terminal, the first switch including a first thyristor having an anode coupled to the first filament terminal, a cathode coupled to the second filament terminal, and a gate coupled to the control circuit;

a second switch having a first terminal coupled to the second filament terminal, a second terminal coupled to the first filament terminal, and a control terminal, the second switch including a second thyristor having an anode coupled to the second filament terminal, a cathode coupled to the first filament terminal, and a gate coupled to the control circuit;

a control circuit coupled to the control terminal of the first switch and to the control terminal of the second switch, the control circuit activating the first switch during the positive phase and activating the second switch during the negative phase;

a zener diode having a cathode coupled to the first filament terminal, and an anode; and a second diode having an anode coupled to the cathode of the zener diode and a cathode coupled to the second filament terminal.

27. The circuit of claim 25, wherein the first thyristor and the second thyristor are within an integrated circuit formed within a single substrate.

28. The circuit of claim 27, wherein:

the first thyristor is a vertical transistor having a cathode gate region formed by a first P-type well disposed within a second P-type well that is doped lower than the first P-type well;

the second thyristor includes an anode gate vertical thyristor, the anode of which is formed by an anode layer of a substantially similar type and doping level as the second P-type well, the anode layer being surrounded by a guard ring having a same conductivity type as a conductivity type of the anode, the guard ring having a lower doping level than a doping level of the anode.

29. The circuit of claim 28, further comprising an auxiliary vertical thyristor, disposed within the integrated circuit, having a cathode gate region formed by a third P-type well disposed within a fourth P-type well that is doped lower than the second P-type well.

30. A method for controlling a fluorescent tube that is powered by an alternating power source having a positive phase and a negative phase, comprising the steps of:

(A) during a first portion of the positive phase, sensing an amount of voltage provided by the alternating power source, said step (A) including storing a charge, from the alternating power source during the first portion of the positive phase, to provide a stored charge, (B) in response to step (A), conducting current from the alternating power source through the fluorescent tube in a first direction through a first unidirectional device during a second portion of the positive phase; and (C) during the negative phase, conducting current from the alternating power source through the fluorescent tube in a second direction through a second unidirectional device.

31. The method of claim 30, wherein step (A) includes applying the stored charge across a voltage limiting device, to detect when a predetermined voltage has been exceeded.

32. The method of claim 30, wherein step (B) includes discharging the stored charge to power a control circuit during the second portion of the positive phase.

33. An apparatus for controlling a fluorescent tube that is powered by an alternating power source having a positive phase and a negative phase, comprising:

first means for sensing an amount of voltage provided by the alternating power source during a first portion of the positive phase, the first means including means for storing a charge from the alternating power source during the first portion of the positive phase, to provide a stored charge;

second means, responsive to the first means, for conducting current from the alternating power source through the fluorescent tube in a first direction through a first unidirectional device during a second portion of the positive phase; and third means, distinct from the first means, for conducting current from the alternating power source through the fluorescent tube in a second direction through a second unidirectional device during the negative phase.

34. The apparatus of claim 33, wherein the first means further includes means for applying the stored charge across a voltage limiting device, to detect when a predetermined voltage has been exceeded.

35. The apparatus of claim 33, further comprising a control circuit that controls the second means and the third means, wherein the second means includes means for discharging the stored charge to power the control circuit during the second portion of the positive phase.

* * * * *